United States Patent
Keser et al.

(10) Patent No.: US 11,211,337 B2
(45) Date of Patent: *Dec. 28, 2021

(54) FACE-UP FAN-OUT ELECTRONIC PACKAGE WITH PASSIVE COMPONENTS USING A SUPPORT

(71) Applicant: Intel Corporation, Santa Clara, CA (US)

(72) Inventors: Lizabeth Keser, Munich (DE); Thomas Ort, Veitsbronn (DE); Thomas Wagner, Regelsbach (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,315

(22) Filed: Dec. 4, 2019

(65) Prior Publication Data

US 2020/0105678 A1    Apr. 2, 2020

Related U.S. Application Data

(63) Continuation of application No. 15/857,189, filed on Dec. 28, 2017, now Pat. No. 10,546,817.

(51) Int. Cl.
*H01L 23/538* (2006.01)
*H01L 21/56* (2006.01)
(Continued)

(52) U.S. Cl.
CPC ........ *H01L 23/5389* (2013.01); *H01L 21/568* (2013.01); *H01L 21/6836* (2013.01);
(Continued)

(58) Field of Classification Search
None
See application file for complete search history.

(56) References Cited

U.S. PATENT DOCUMENTS 6,546,620 B1 *  4/2003  Juskey ............... H01L 24/81
                                                  228/180.21
8,174,119 B2 *  5/2012  Pendse ............... H01L 24/13
                                                  257/738

(Continued)

FOREIGN PATENT DOCUMENTS

| EP | 3104409 A2 | 12/2016 |
| WO | WO-2016209172 A1 | 12/2016 |
| WO | WO-2017124670 A1 | 7/2017 |

OTHER PUBLICATIONS

"U.S. Appl. No. 15/857,189, Non Final Office Action dated May 30, 2019", 10 pgs.

(Continued)

*Primary Examiner* — Evren Seven
(74) *Attorney, Agent, or Firm* — Schwegman Lundberg & Woessner, P.A.

(57) ABSTRACT

A face-up fan-out electronic package including at least one passive component located on a support. The electronic package can include a die. The die can include a plurality of conductive pillars having a proximal end communicatively coupled to the first side of the die and a distal end opposite the proximal end. A mold can at least partially surround the die. The mold can include a first surface that is coplanar with the distal end of the conductive pillars and a second surface opposing the first surface. In an example, the passive component can include a body and a lead. The passive component can be located within the mold. The lead can be coplanar with the first surface, and the body can be located at a distance from the second surface. The support can be located between the body and the second surface.

20 Claims, 5 Drawing Sheets

(51) Int. Cl.
*H01L 23/00* (2006.01)
*H01L 21/683* (2006.01)
*H01L 25/16* (2006.01)
*H01L 25/00* (2006.01)
*H01L 23/498* (2006.01)

(52) U.S. Cl.
CPC .............. *H01L 24/14* (2013.01); *H01L 24/19* (2013.01); *H01L 24/96* (2013.01); *H01L 24/97* (2013.01); *H01L 25/16* (2013.01); *H01L 25/50* (2013.01); *H01L 21/561* (2013.01); *H01L 23/49816* (2013.01); *H01L 23/49827* (2013.01); *H01L 2224/0233* (2013.01); *H01L 2224/04105* (2013.01); *H01L 2224/12105* (2013.01); *H01L 2224/2919* (2013.01); *H01L 2224/32225* (2013.01); *H01L 2224/32245* (2013.01); *H01L 2224/73267* (2013.01); *H01L 2224/92244* (2013.01); *H01L 2924/145* (2013.01); *H01L 2924/1431* (2013.01); *H01L 2924/1432* (2013.01); *H01L 2924/1434* (2013.01); *H01L 2924/1435* (2013.01); *H01L 2924/1438* (2013.01); *H01L 2924/15153* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H01L 2924/351* (2013.01)

(56) References Cited

U.S. PATENT DOCUMENTS

| | | | | |
|---|---|---|---|---|
| 8,822,268 | B1* | 9/2014 | Magnus | H01L 23/5383 438/107 |
| 8,890,284 | B2* | 11/2014 | Kilger | H01L 24/82 257/528 |
| 8,932,907 | B2* | 1/2015 | Cho | H01L 24/19 438/107 |
| 9,748,189 | B2* | 8/2017 | Hung | H01L 24/19 |
| 10,074,604 | B1* | 9/2018 | Hou | H01L 23/3185 |
| 10,163,841 | B2* | 12/2018 | Lin | H01L 24/14 |
| 2006/0158804 | A1* | 7/2006 | Usui | H01L 25/50 361/58 |
| 2007/0246806 | A1* | 10/2007 | Ong | H01L 23/5389 257/666 |
| 2009/0152715 | A1* | 6/2009 | Shim, II | H01L 21/568 257/737 |
| 2009/0160053 | A1* | 6/2009 | Meyer | H01L 23/3128 257/738 |
| 2009/0224402 | A1* | 9/2009 | Do | H01L 21/568 257/738 |
| 2009/0230553 | A1* | 9/2009 | Meyer | H01L 21/568 257/738 |
| 2009/0236751 | A1* | 9/2009 | Chin | H01L 24/32 257/777 |
| 2010/0123217 | A1* | 5/2010 | Poeppel | H01L 25/0655 257/536 |
| 2010/0155126 | A1* | 6/2010 | Kunimoto | H01L 24/96 174/260 |
| 2010/0244222 | A1* | 9/2010 | Chi | H01L 23/49816 257/690 |
| 2011/0018123 | A1* | 1/2011 | An | H01L 24/19 257/693 |
| 2011/0068444 | A1* | 3/2011 | Chi | H01L 21/6835 257/669 |
| 2011/0304016 | A1* | 12/2011 | Nakamura | H01L 21/4857 257/532 |
| 2012/0074585 | A1* | 3/2012 | Koo | H01L 23/49827 257/774 |
| 2012/0286415 | A1* | 11/2012 | Sakai | H01L 21/78 257/734 |
| 2013/0001776 | A1 | 1/2013 | Yu et al. | |
| 2013/0147041 | A1* | 6/2013 | Chan | H01L 25/105 257/738 |
| 2015/0179570 | A1* | 6/2015 | Marimuthu | H01L 25/0655 257/774 |
| 2015/0382463 | A1* | 12/2015 | Kim | H05K 3/4007 361/767 |
| 2016/0064309 | A1* | 3/2016 | Su | H01L 23/5389 257/773 |
| 2016/0260695 | A1* | 9/2016 | Chung | H01L 25/18 |
| 2016/0276307 | A1* | 9/2016 | Lin | H01L 23/552 |
| 2016/0300797 | A1* | 10/2016 | Shim, II | H01L 23/5389 |
| 2016/0336303 | A1* | 11/2016 | Tsai | H01L 21/563 |
| 2016/0343635 | A1* | 11/2016 | Rae | H01L 21/4846 |
| 2016/0343651 | A1* | 11/2016 | Rae | H01L 24/96 |
| 2017/0243845 | A1* | 8/2017 | Lee | H01L 21/31051 |
| 2017/0345764 | A1* | 11/2017 | Chang | H01L 23/49811 |
| 2018/0158779 | A1* | 6/2018 | Yang | H01L 21/568 |
| 2018/0182691 | A1* | 6/2018 | Cho | H01L 24/20 |
| 2018/0190513 | A1* | 7/2018 | Chew | H01L 23/49827 |
| 2018/0331080 | A1* | 11/2018 | Geissler | H01L 24/24 |
| 2019/0122993 | A1* | 4/2019 | Kim | H01L 23/3107 |
| 2019/0206799 | A1 | 7/2019 | Keser et al. | |

OTHER PUBLICATIONS

"U.S. Appl. No. 15/857,189, Notice of Allowance dated Sep. 12, 2019", 9 pgs.

"U.S. Appl. No. 15/857,189, Response filed Aug. 29, 2019 to Non-Final Office Action dated May 30, 2019", 8 pgs.

"U.S. Appl. No. 15/857,189, Restriction Requirement dated Mar. 15, 2019", 5 pgs.

"U.S. Appl. No. 15/857,189. Response filed May 15, 2019 to Restriction Requirement dated Mar. 15, 2019", 7 pgs.

"European Application Serial No. 18209005.0, Extended European Search Report dated Mar. 29, 2019", 15 pgs.

\* cited by examiner

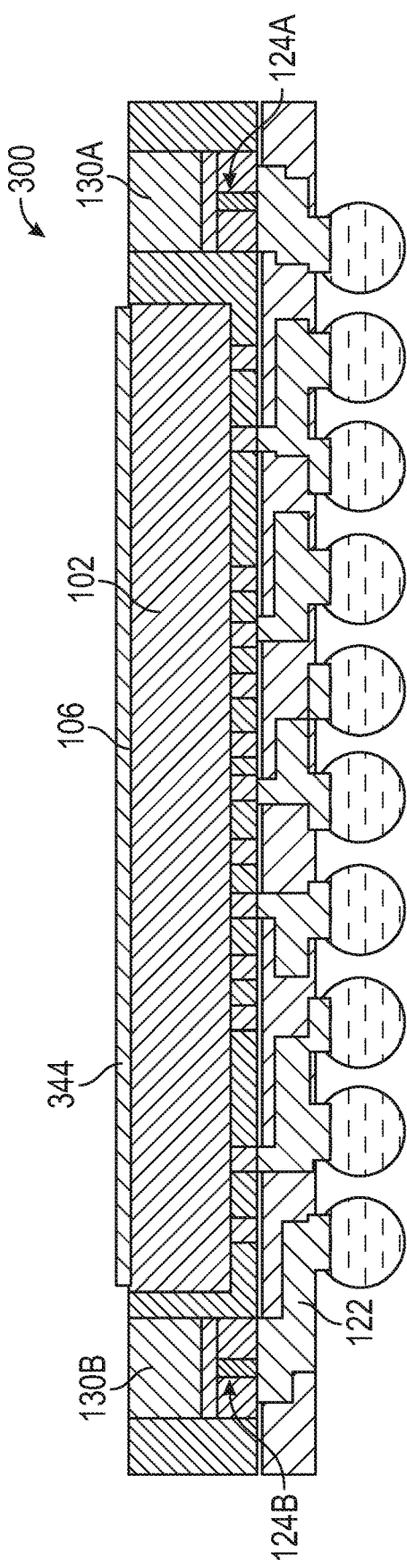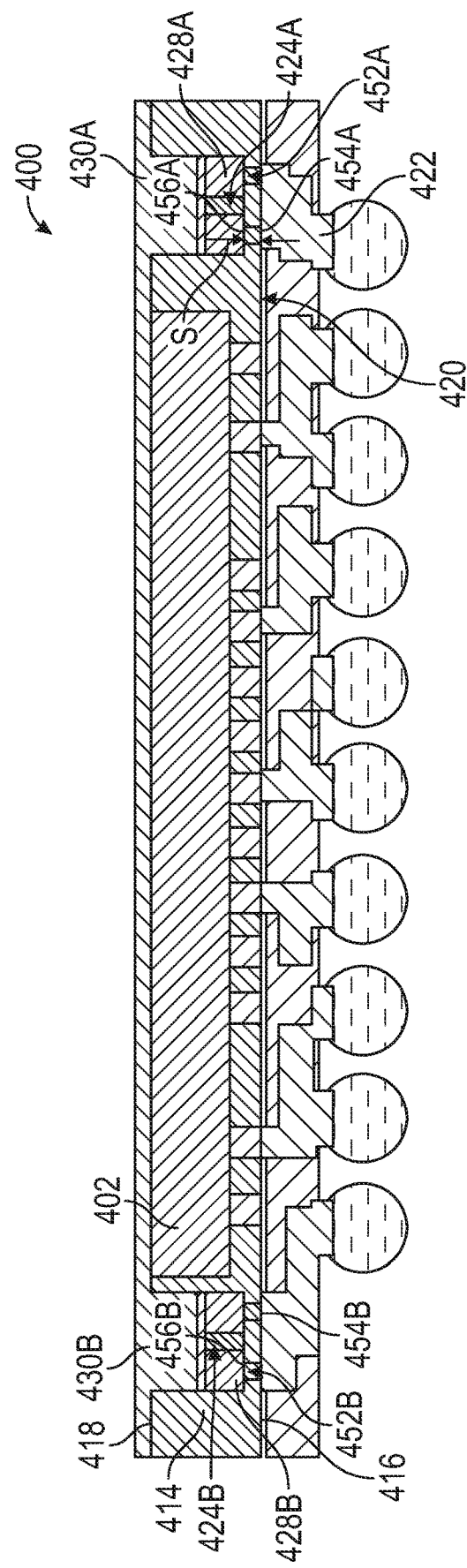

FACE-UP FAN-OUT ELECTRONIC PACKAGE WITH PASSIVE COMPONENTS USING A SUPPORT

CROSS-REFERENCE TO RELATED APPLICATION

This application is a continuation of U.S. patent application Ser. No. 15/857,189, filed Dec. 28, 2017, which is incorporated by reference herein in its entirety.

TECHNICAL FIELD

This document pertains generally, but not by way of limitation, to electronic packaging, such as face-up fan-out electronic packaging.

BACKGROUND

Fan-out semiconductor packaging (e.g., fan-out wafer-level packaging) can use wafer processing technology to construct interconnect features of an electronic package. Accordingly, interconnections having a reduced length and increased density can be provided as compared to other packaging configurations, such as wire bonded or flip-chip packages. At least two configurations of fan-out packaging can be utilized. Those configurations include face-down and face-up fan-out packages. Face-down packages are constructed by placing a die (or other semiconductor device) on to a carrier with conductive pillars or conductive bondpads of a die facing the carrier. The carrier can then be populated with other components, such as passive components, also having leads (e.g., conductive leads) placed on to the carrier. The carrier, die, and other components are then molded, and the carrier is removed. Accordingly, the conductive pillars and component leads are exposed for assembly with a redistribution layer. Because the die and other components are often attached to the carrier with an adhesive, the conductive pillars and component leads can protrude from the mold. In some instances, the pitch of the conductive pillars and component leads are increased to accommodate locational tolerances related to the face-down process.

Face-up configurations can be constructed by placing the die with the conductive pillars facing away from the carrier. After the mold is applied, the conductive pillars can be exposed for further interconnection by cutting or lapping or grinding operation. This can mitigate the technical challenge posed by the topography of the conductive pillars and component leads relative to the mold surface in face-down configurations. However, other challenges can occur if other components are desired within the face-up packages. For instance, when other components are placed face-up (e.g., with the leads facing away from the carrier), the leads of the component and the conductive pillars may not be aligned. Consequently, when the cutting or grinding operation is performed, some of the conductive pillars and component leads may not be exposed through the mold. This lack of alignment provides challenges in electrically coupling both the die as well as other components to the redistribution layer. Accordingly, packaging configurations incorporating other components, such as passive components, into face-up fan-out electronic packages would be desirable.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3 illustrates another example of an electronic package including a support frame for a passive component, according to an embodiment.

FIG. 4 depicts an example of an electronic package including a support for a passive component having a via, according to an embodiment.

DETAILED DESCRIPTION

The present application relates to devices and techniques for a face-up fan-out electronic package, such as a face-up fan-out electronic package including a support for holding a passive component. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other things, that a technical challenge can include electrically coupling one or more passive components to a redistribution layer of a face-up fan-out electronic package. The present subject matter can provide a solution to this problem. In an example, a support can be included in a face-up fan-out electronic package to hold one or more passive components. The support can position a lead of the passive component to be coplanar with a flat mounting surface of the electronic package. Accordingly, the one or more passive components and the die can be electrically coupled to a redistribution layer located along the flat mounting surface. The planarity of the flat mounting surface (including the coplanar leads and conductive pillars of a die) can provide for smaller pitches between the leads, conductive pillars, and combinations thereof. In a further example, a through-mold via that is coplanar with the flat mounting surface can provide an electrical connection between the flat mounting surface and the one or more leads of the passive components. Accordingly, passive components can be integrated into face-up fan-out electronic packages, and the footprint of the electronic package can be reduced, or electrical connections can be shortened (e.g., to increase electrical performance), or combinations thereof.

Figure 1:
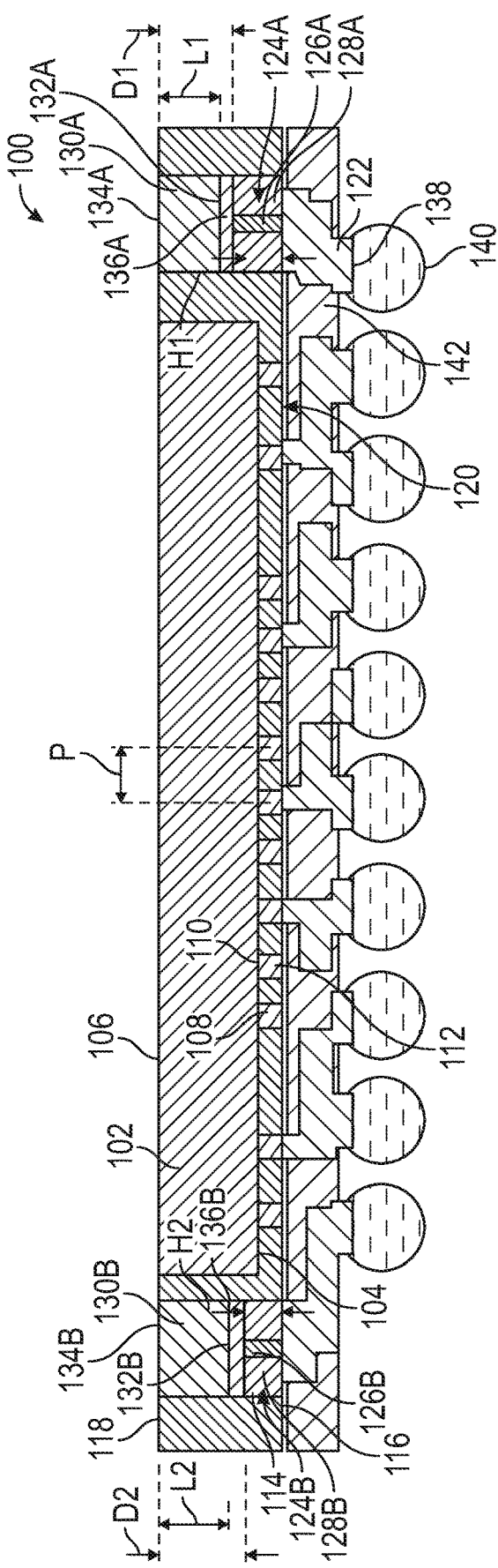
FIG. 1 illustrates an example of an electronic package including a support for a passive component, according to an embodiment.

FIG. 1 illustrates an example of an electronic package 100 including at least one support for one or more passive components. For instance, in the example of FIG. 1, the electronic package 100 can be a face-up fan-out electronic package. The electronic package 100 can include at least one die, mold, passive component, and support. As shown in the example of FIG. 1, the electronic package 100 includes a die 102 having a first side 104 and a second side 106. A plurality of conductive pillars (e.g., conductive pillars 108) can be coupled to the die 102. For instance, each conductive pillar 108 can include a proximal end 110 and a distal end 112. The proximal end 110 can be communicatively coupled to the first side 104 of the die 102 (e.g., a semiconductor device within the die 102. A mold, such as mold 114, can at least partially surround the die 102. The mold 114 can include a first surface 116 that is coplanar with the distal end 112 of the conductive pillars 108 and a second surface 118 opposing the first surface 116. A passive component, such as passive component 124A or 124B, can be located within the mold 114. The passive component can include a body (e.g., body 126A or 126B) and at least one lead (e.g., lead 128A or 128B). The lead can be coplanar with the first surface 116. Where the body has a dimension that is less than the thickness of the mold, the body can be located at a distance from the second surface 118. To hold the passive component, a support can be located between the body at the second surface 118. At least one routing layer 122 can be electrically coupled to one or more of the distal ends 112 of the conductive pillars 108.

The die 102 can include a processor (e.g., graphics processing unit (GPU) or central processing unit (CPU)), memory package (e.g., random access memory (RAM), flash memory, read only memory (ROM)), or other logic or memory package. As previously described, the die 102 can include the first side 104 (e.g., active side) and the second side 106 (a second die side) opposing the first side 104. The plurality of conductive pillars 108 can be attached to the first side 104 of the die 102. For instance, the plurality of conductive pillars 108 can be electrically coupled to respective contacts along the first side 104 for communicatively coupling the die 102 to an electronic device. The conductive pillars 108 can be an electrically conductive material, such as copper, and can be deposited on the contacts of the die 102. In an example, the conductive pillars 108 can be plated on to the first surface 104 of the die 102. For instance, the conductive pillars 108 can be constructed by a process including, but not limited to, electroplating, electroless plating, sputtering, vapor deposition, or deposition by other plating processes. The one or more conductive pillars 108 can include the proximal end 110 and the distal end 112. The proximal end 110 can be attached to the first side 104 and the distal end 112 can be located at an opposing end of the proximal end 110.

The mold 114 can partially surround the die 102 to protect and provide structural support for the die 102 and the plurality of conductive pillars 108. In some examples, the mold 114 can be constructed from a material including, but not limited to, epoxy, polymer, or other mold compound. The mold 114 and can be constructed by processes including, but not limited to, compression molding, injection molding, stencil printing, potting, or the like. In the example of FIG. 1, the mold 114 can surround the die 102 on five sides with the second side 106 of the die 102 exposed through the mold 114 (e.g., not covered by the mold). In other words, the mold 114 can have a first surface 116 and a second surface 118. The first surface 116 can be coplanar with the distal end 112 of the one or more conductive pillars 108. The second side 106 of the die 102 can be located along the second surface 118 of the mold 114. As used herein, the term coplanar refers to surfaces that are substantially parallel (e.g., are parallel within 1 micron or less). When referring to a location that is along the surface, a parallel relationship also exists with a wider tolerance range than coplanar features. For instance, the features can be parallel within 20 microns In an example, the mold 114 can be applied to the die 102 after the conductive pillars 108 are attached to the die 102. The first surface 116 of the mold 114 and the distal end 112 of the conductive pillars 108 can be cut, ground, lapped, polished, or any combination thereof to provide a flat mounting surface 1. For example, the flat mounting surface 120 includes the first surface 116 of the mold 114 that is coplanar with the distal end 112 of the conductive pillars 108. Thus, the flat mounting surface 120 can have a planarity of less than two-microns (e.g., corresponding to the coplanarity of the distal end 112 of the conductive pillars 108 and the first surface 116 of the mold 114). Accordingly, the mold 114 can be located between the plurality of conductive pillars 108. For instance, the mold 114 can be located between the distal end 112 and the proximal end 110 of the plurality of conductive pillars 108.

As the pitch P of the conductive pillars 108 decreases, variation within the locations of the distal ends 112 of the conductive pillars 108, variation within the planarity (e.g., flatness) of the first surface 116, or variation in the location of the distal end 112 of the conductive pillars 108 along the first surface 116 can result in defects in the electrical coupling of the conductive pillars 108 to the routing layer 122. The coplanar relationship between the distal end 112 of the at least one conductive pillar 108 and the first surface 116 of the mold 114 can provide the flat mounting surface 120 for coupling the molded die (the die 102 located within the mold 114) to the one or more routing layers 122. Accordingly, defects related to electrical coupling can be reduced and the pitch P of the conductive pillars 108 can be decreased.

The electronic package 100 can include a passive component or a plurality of passive components located within the mold 114. In the example of FIG. 1, the electronic package 100 includes two passive components, such as a first passive component 124A and a second passive component 124B. The passive components can include, but are not limited to, a resistor, capacitor, inductor, or other type of passive component. Each of the passive components can include a body and at least one lead. For instance, the first passive component 124A includes a first body 126A and a first lead 128A, and the second passive component 124B includes a second body 126B and a second lead 128B. In the example of FIG. 1, each passive component can include two leads. The passive components can be located within the mold 114 so the one or more leads (e.g., 128A or 128B) can be coplanar with the first surface 116.

In an example, one or more of the passive components can be located at a distance from the second surface 118 of the mold 114. For instance, in the example of FIG. 1, the first body 126A (e.g., a side of the passive component opposite of the one or more leads) of the first passive component 124A can be located at a distance D1 from the second surface 118 of the mold 114. The second body 126B of the second passive component 124B can be located at a distance D2 from the second surface 118. The second body 126B can have a smaller dimension H2 than the dimension H1 of the first body 126A. In other examples, a second die or a plurality of additional dies can be located within the mold 114. The corresponding conductive pillars or leads of the additional dies can be coplanar with the first surface of the mold 116.

The electronic package 100 can include a support or a plurality of supports. In the example of FIG. 1, the electronic package 100 includes two supports, such as the first support 130A and the second support 130B. One or more of the supports can hold the passive component (e.g., passive component 124A or 124B) within the mold 114 at a distance (e.g., distance D1 or D2) from the second surface 118. Accordingly, one or more of the leads (e.g., leads 128A or 128B) can be coplanar with the first surface 116 of the mold 114. The supports, such as support 130A or 130B, can be located between the second surface 118 and the passive component, such as passive components 124A or 124B respectively. For instance, in the example of FIG. 1, the first support 130A can be located between the second surface 118 and the first passive component 124A, and the second support 130B can be located between the second surface 118 and the second passive component 124B. A first end of the support can be coupled to the passive component and a second end of the support can be located along or coplanar with the second surface 118. For instance, a first end 132A of the first support 130A can be coupled to the first passive component 124A, and a second end 134A of the first support 130A can be located along or coplanar with the second surface 118. A first end 132B of the second support 130B can be coupled to the second passive component 124B, and a second end 134B of the second support 130B can be located along or coplanar with the second surface 118. For example, one or more of the supports can be exposed through the second surface 118. In other words, in some examples, one or more of the second ends (e.g., 134A or 134B) of the respective supports are not covered by the mold 114.

In various examples, the supports can include different lengths. For instance, at least one support can have a different height than one or more of the other supports. In the example of FIG. 1, where the body 126B of the second passive 124B has a smaller dimension H2 than the dimension H1 of the body 126A of the first passive 124A. The first support 130A can include a height L1 to support the first passive component 124A, and the second support 130B can include a longer height L2 to support the second passive component 124B.

The one or more supports (e.g., supports 130A or 130B) can be constructed from a material including, but not limited to, a metal, such as copper, steel, aluminum; a polymer; or other materials. The material of the supports can be selected to reduce the effect of thermal expansion on the location of the passive component during the construction or use of the electronic package 100. In other words, the material of the support can be selected to increase the dimensional stability of the location of the passive component with respect to the first surface 116 of the mold 114 and the distal end 112 of the conductive pillars 108. In an example, the material of the support can also help to maintain the dimensional stability of the die 102 and keep in from moving during the molding process. Accordingly, the supports 130A, 130B can hold the location of the one or more passive components at a distance, such as the distance D1 or D2 with respect to the second surface 118 so the leads 128A, 128B of the respective passive components 124A, 124B are coplanar with the first surface 116 (e.g., the flat mounting surface 120).

An adhesive can be located between the support and the passive component. The adhesive can hold the passive component on the support, for instance, during or after the application of the mold. As shown in the example of FIG. 1, an adhesive 136A can coupled between the support 130A and the passive component 124A. An adhesive 136B can be coupled between the support 130B and the passive component 124B. The adhesive (e.g., adhesive 136A or 136B) can include, but is not limited to, a film, liquid coating, or other form of adhesive disposed between the passive component and the support. In a further example, the support can include a solder coating to hold the passive component on the support. In an example, the adhesive can be a pressure sensitive film applied to the first end of the support and bonded to the passive component. In some examples, the adhesive can electrically isolate the passive component from the support.

At least one routing layer 122 can be electrically coupled to one or more of the distal ends 112 of the conductive pillars 108. The routing layer can include, but is not limited to one or more electrically conductive pathways, such as one or more copper traces. The leads (e.g., leads 128A or 128B) of the passive components (e.g., 124A or 124B) can also be electrically coupled to one or more routing layers as shown in the example of FIG. 1. The routing layer 122 can include a plurality of contacts 138 to communicatively couple the die 102 or at least one of the passive components 124A, 124B to an electronic device. For instance, a plurality of solder balls 140 or controlled collapse chip connections (also known as a C4 interconnects or a flip chip interconnects) can be electrically coupled to the routing layer 122.

In some examples, a dielectric layer 142 can be disposed between the second surface 118 and the routing layer 122. For instance, the routing layer 122 and the dielectric layer 142 can be included in a redistribution layer, substrate, printed circuit board (PCB), bumpless buildup layer (BBUL) flexible circuit, or the like that includes the routing layer 122. For instance, the electronic package can include a redistribution layer, substrate, printed circuit board (PCB), bumpless buildup layer (BBUL) flexible circuit, or the like, that includes the routing layer and the dielectric layer. To be compatible with the electronic device, the electrical contacts 138 can have a different size, pattern, or location than the conductive pillars 108 or the lead (e.g., 128A or 128B) of the passive components (e.g., 124A or 124B). Accordingly, the routing layer 122 can provide an interface to electrically couple the electronic package 100 to an electronic device.

In various examples, the electronic package 100 can be a fan-out package. In the example of FIG. 1, the electronic package 100 is a face-up fan-out package. In some instances, the pitch P between the conductive pillars or the leads can be increased to accommodate variation in the planarity among the second surface 118 and the distal end 112 of the conductive pillars 108. The flat mounting surface 120 (e.g., the coplanar second surface 118, distal end 112 of the conductive pillars 108, and leads 128A, 128B) of the present disclosure can provide for reduced variation in the planarity (e.g., parallelism) of the second surface 118 and the plurality of conductive pillars or leads. Reducing the variation in planarity can mitigate defects related to placement location, electrical shorting between conductive pillars or leads, insufficient electrical connections, or other connection or soldering issues. Accordingly, the pitch P between the conductive pillars, leads, or various combinations thereof can be decreased. Decreasing the pitch can provide for smaller overall package sizes.

Figure 2:
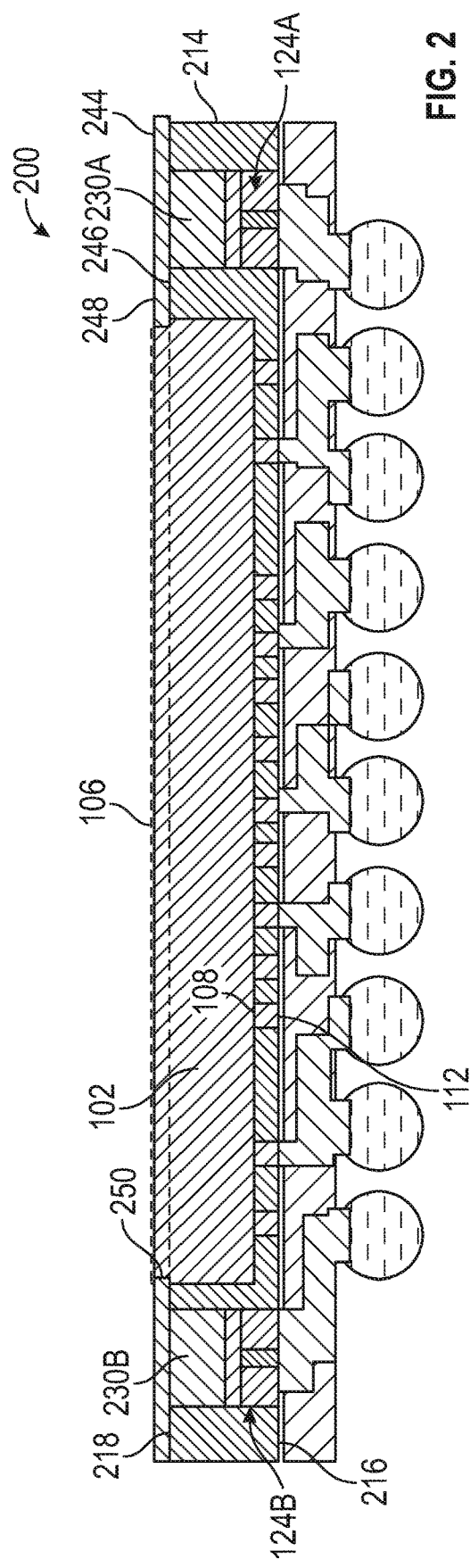
FIG. 2 depicts an example of an electronic package including a support frame for a passive component, according to an embodiment.

FIG. 2 depicts an example of another electronic package 200 including a support frame 244 for the one or more passive components 124A, 124B. A mold 214 can at least partially surround the die 102 and the distal end 112 of the plurality of conductive pillars 108 can be located coplanar with a first surface 216 of the mold 214. The second side 106 of the die 102 can be located along a surface of the support frame 244. The support can have a first surface 246 and a second surface 248. In some examples, the first surface 246 or the second surface 248 can be planar. The first surface 246 of the support frame 244 can be located along the second surface 218, and the second surface 248 of the support frame 244 can be located in parallel with the second side 106 of the die 102. In some examples, the support frame 244 can be located along the entirety of the second surface 218 or along a portion of the second surface 218. The support frame 244 can include various shapes and configurations. For instance, the support frame 244 can include, but is not limited to, a solid panel, a panel with one or more apertures, or one or more strips of material.

The support frame 244 can include the one or more supports, such as support 230A or support 230B. The supports 230A, 230B can include aspects of supports 130A or 130B as shown and described herein. For instance, the supports 230A, 230B can be coupled to the first surface 246 opposing the second surface 248. In some examples, the support frame 244 can hold the one or more supports 230A, 230B in fixed relation. In an example, the one or more supports can be extended from the first surface 246, such as transverse or perpendicular to the first surface 246.

The die 102 can be coupled to the support frame 244. For instance, an adhesive or die attach film can couple the second side of the die 106 to the support frame 244. Changes in temperature or curing of the mold can result in shifting of the relative positions of the die 102, supports (230A, 230B), or passive components (124A, 124B). For instance, differences in the coefficient of thermal expansion (CTE) can lead to shifting in the relative position of the die, supports, or passive components. In an example, a material of the support frame 244 can be selected to reduce shifting among the die, supports, or passive components. The material of the support frame 244 or the supports can include, but is not limited to, copper, stainless steel, aluminum, or the like. Accordingly, the support frame 244 can hold the die, supports, or passive components in position to reduce the amount of shift in relative position.

In the example of FIG. 2, the support frame 244 can include a die holder 250. The die holder 250 can anchor the die 102 within the electronic package 200 to reduce the relative location shift among the die, supports, and one or more passive components. In various examples, the die holder 250 can include, but is not limited to, an aperture, one or more ribs, gussets, pins, or the like. The location of the die 102 on the support frame 244 can be constrained by the die holder 250. For instance, the location of the die 102 with respect to the support frame 244 can be constrained within a tolerance range. Accordingly, the amount of location shift of the die 102 (e.g., corresponding to temperature changes or mold curing) with respect to the support frame 244, the supports, and passive components can be reduced. In other words, the die holder 250 can increase the locational stability of the die 102 with respect to the supports or the passive components. Reducing the amount of location shift can provide a decrease in defects related to placement location, electrical shorting between conductive pillars (e.g., conductive pillars 108), electrical shorting between leads, insufficient electrical connections, or other defects related to connection or soldering. In some examples, the pitch (e.g., pitch P) among the conductive pillars, leads, or various combinations thereof can be decreased corresponding to the reduction of the location shift. Decreasing the pitch can provide for smaller overall package sizes as the die or corresponding passive components can either be shrunk in size or arranged closer together in a smaller package design.

FIG. 3 illustrates an example of an electronic package 300 including another example of a support frame 344. The support frame 344 can include the features of the support frame 244 from the example of FIG. 2. In the example of FIG. 3, portions of the support frame 344 have been removed. For instance, as shown, portions of the support frame 344 previously coupled to the supports 130A, 130B have been removed, for example, to electrically or thermally isolate the support frame 344 from the supports 130A, 130B or the passive components 124A, 124B. In other examples, the support frame 344 can include the supports 130A, 130B as shown in the example of FIG. 2. In some examples, the support frame 344 can be electrically coupled or thermally coupled to the supports, the passive components, or a combination thereof. The support frame 344 can be located along the second surface 106 of the die 102. For instance, the support frame 344 can be attached, electrically coupled, or thermally coupled to the second side 106. In an example, the support frame 344 can be thermally coupled to the second side 106 for dissipating heat from the die 102. In other words, the support frame 344 can be a heatsink configured to transfer heat from the die 102. For instance, the support frame 344 can be constructed of a thermally conductive material, such as copper or aluminum. In a further example, the support frame 344 can include a sufficient thermal mass or can include fins or other geometry configured to increase the transfer of heat from the die 102 through the support frame 344.

In some examples, the support frame 344 can be electrically coupled to a circuit to route electrical signals. For instance, the support frame can be electrically conductive and configured to communicate electrical signals of the die 102, the routing layer 122, or the one or more passive components (e.g., 124A, 124B). In an example, the die 102 can include one or more through silicon vias that are electrically coupled to the support frame 344. In an example, the support frame 344 can be electrically coupled to one or more of the routing layers 122. In a further example, the support frame 344 can be a ground plane for one or more circuits of the electronic package 300. In other examples, one or more passive components can be communicatively coupled to the die 102 through the support frame 344. For instance, the support (e.g., support 130A, 130B) can be electrically coupled to a lead (e.g., lead 128A, 128B) and the die 102 can be electrically coupled to the support through the support frame 344.

FIG. 4 depicts a cross section of another example of an electronic package 400. The electronic package 400 includes at least one passive component having a lead within a mold 414. In the example of FIG. 4, the electronic package 400 includes a first passive component 424A and a second passive component 424B. The lead of the passive component can be offset from the first surface 416 at a spacing S. In some instances, removing material from the lead of the passive component to form the flat mounting surface, such as the flat mounting surface 120 shown in the example of FIG. 1, can cause the lead to lose structural integrity or can cause the removal of the lead entirely. In other examples, removing material can cause the removal of a portion of the body of the passive component. Offsetting the lead at a distance S within the mold 414 can mitigate the possibility of removing material from the passive component. A through mold via 452A, 452B can be located between at least one lead of the passive component 424A, 424B and a first surface 416 to electrically couple the passive component to one or more routing layers and correspondingly the electronic device. Accordingly, the through-mold via (e.g., through-mold via 452A, 452B) can include a first end 454A, 454B that is coplanar with the first surface 416 and a second end 456A, 456B electrically coupled to the respective leads 428A, 428B. Accordingly, the electronic package 400 can include a flat mounting surface 420 for electrically coupling a die 402 and one or more passive components 424A, 424B to the one or more routing layers 422.

Where the through-mold via 452A, 452B provides an electrical connection between the flat mounting surface 420 and the one or more leads of the respective passive components, the passive components can be located at various positions within the mold. Accordingly, the passive component is not limited to locations where the lead of the passive component is coplanar with the first surface 416. For instance, as shown in the example of FIG. 4, the passive component 424A or passive component 424B can be positioned on a support 430A or a support 430B respectively. The height of the supports can be configured to position the leads within the mold. Accordingly, the passive component can be located at a distance from the second surface 418. In other examples, one of skill in the art would recognize that the passive component could be located directly along the second surface 418. In this example, the passive component can be exposed through the second surface 418 due to the process of constructing the electronic package.

FIGS. 5A-5F illustrate a process for making an electronic package 500 including a support for a passive component, such as the electronic packages 100, 200, 300, and 400 previously described in the examples herein and shown for instance in FIGS. 1-4. In describing the process, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the process include, but are not limited to, the corresponding numbered elements provided herein. Other corresponding features described herein (both numbered and unnumbered) as well as their equivalents are also considered.

Figure 5A:
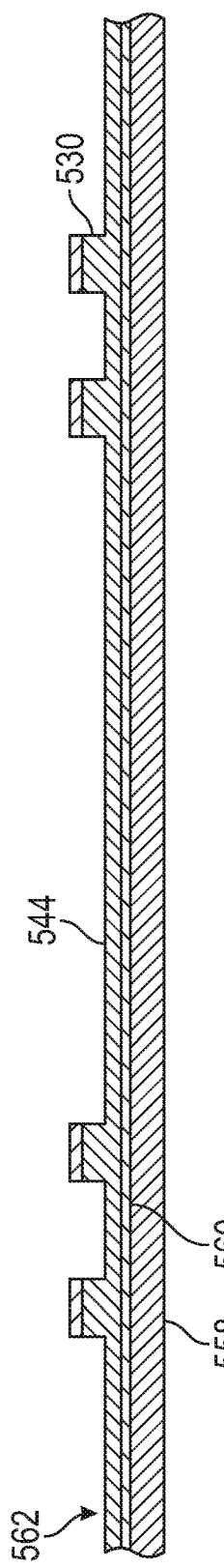
FIGS. 5A-5F illustrate a process for making an electronic package including a support for a passive component, according to an embodiment.

As depicted in FIG. 5A, a support frame 544 can be attached to a carrier 558. For instance, the support frame 544 can be attached to the carrier 558 with an adhesive 560, such as a pressure sensitive film, die attach film, spray, coating, or other type of adhesive. The support frame 544 can include at least one support 530 as previously described in the examples of FIGS. 1-4. In an example, the one or more supports 530 can be constructed on the support frame 544 by additive or subtractive processes, such as etching, machining, plating, or the like. In further examples, attaching the support frame 544 to the carrier 558 can include constructing the support frame 544 on the carrier in situ. The carrier 558 can include a sheet constructed of stainless steel, aluminum, copper, or other material for providing support and rigidity to the support frame 544. In the example of FIG. 5A, a support frame panel 562 can be attached to the carrier 558. The support frame panel 562 can include a plurality of support frames 544. For instance, the plurality of support frames 544 can be arranged as a single component into the support frame panel 562. Accordingly, a plurality of electronic packages, such as electronic packages 100, 200, 300, or 400, can be constructed on a single carrier 558.

Figure 5B:
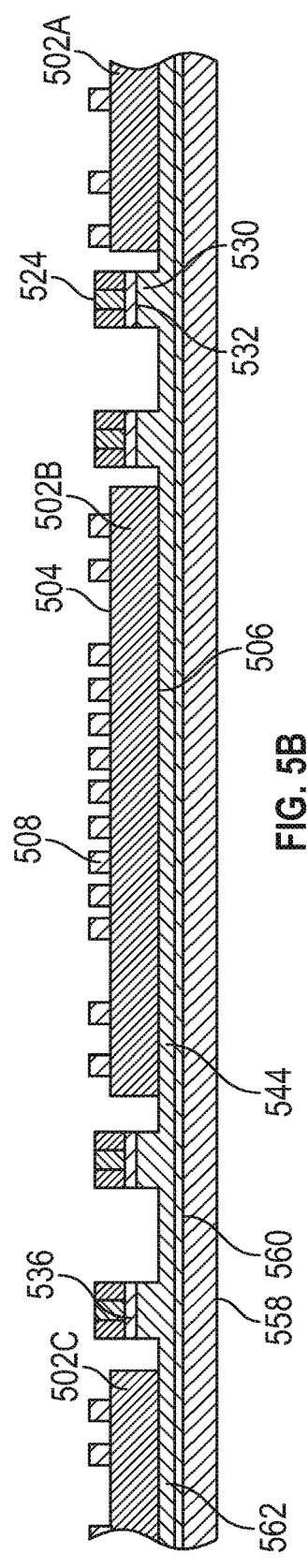
Figure 5C:
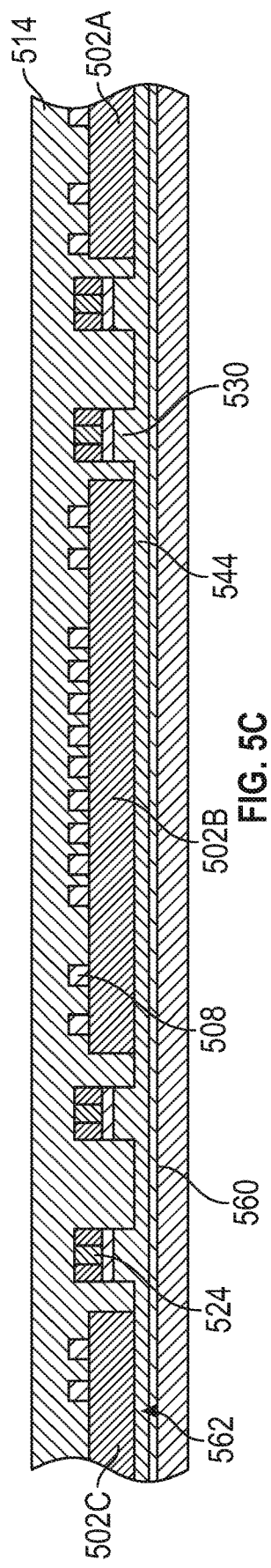

At FIG. 5B, a die can be attached to the support frame 544 or the carrier 558. In an example, a plurality of dies 502A-C can be attached to the support frame 544 or the support frame panel 562, as depicted in FIG. 5B. For example, a second side 506 of the one or more dies can be coupled to the support frame 544, such as bonded with die attach film or other adhesive to the support frame 544, as shown in the example of FIG. 5B. A first side of the die 504 (e.g., the active side including one or more conductive pillars 508) can be facing away from the support frame 544 (e.g., upward). In examples where the support frame 544 includes a die holder feature (e.g., an aperture in the support frame) the one or more dies 502A-C can be coupled directed to the carrier 558 with an adhesive (e.g., die attached film) as previously described.

As shown in the example of FIG. 5B, at least one passive component 524 can be placed on a first end 532 of the support 530. In some examples, the passive component 524 can be coupled to the first end 532 with an adhesive 536, such as the adhesive previously described herein. The adhesive 536 can be located between the passive component 524 and the first end 532.

At 5C, a mold 514 (e.g., molding material) can be disposed over the die (e.g., dies 502A-C), conductive pillars 508, supports 530 (and in some examples, support frame 544 or support frame panel 562), and passive component 524. In some examples, the mold 514 can be epoxy, polymer, or other mold compound and can be constructed by processes including, but not limited to, compression molding, injection molding, potting, or the like. In an example, by anchoring the die (e.g., one or more of dies 502A-C) and the passive component 524, the support frame 544 can to reduce location shifting of the die (or dies 502A-C) during mold application or curing.

Figure 5D:
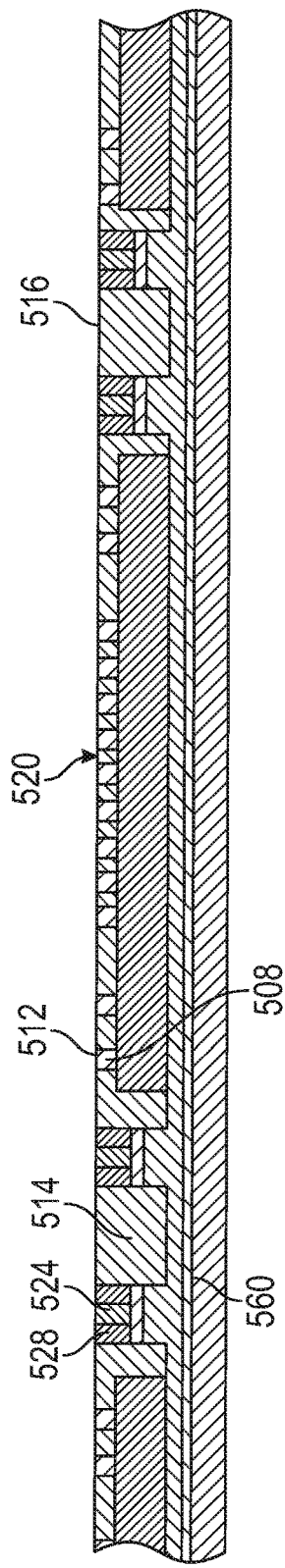

As shown in the example of FIG. 5D, material can be removed from a lead 528 of the passive component 524, distal end 512 of the conductive pillar 508, and the mold 514 to form a flat mounting surface 520. For instance, the mold 514, the lead 528, and the distal end 512 of the conductive pillars 508 can be cut, ground, polished, or any combination thereof to provide the flat mounting surface 520. Removal of material from the mold 514 can form the first surface 516 of the mold 514. In an example, the flat mounting surface 520 can have a planarity of less than two-microns (e.g., corresponding to the parallelism of the distal end of the conductive pillars 512 and the first surface 516). Accordingly, the pitch of the conductive pillars 508, the leads 528, or a combination thereof can be reduced. In a further example, defects related to electrically coupling the die 502 or passive component 524 to a routing layer (e.g., routing layer 522 shown in FIG. 5) can be reduced.

Figure 5E:
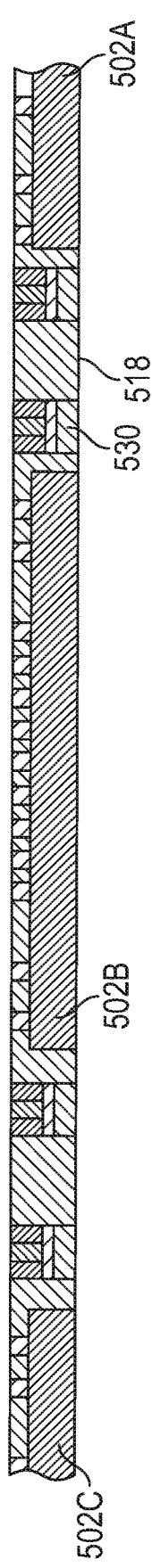

At FIG. 5E, the carrier 558 can be removed from the second surface 518, support frame 544, support 530, support frame panel 562, die (e.g., 502A, B, C), or a combination thereof. In an example, heat can be applied to release the adhesive 560 between the carrier 558 and the second surface 518. The heat can cause thermal degradation of the adhesive 560 to release the carrier 558. In other examples, the carrier can be removed mechanically, by using a chemical solvent, or by other methods of separation.

In various examples, at least a portion of the support frame 544 can be removed or the whole support frame 544 can be removed from the second surface 518. For instance, the support frame 544 can be etched or mechanically removed. Accordingly, the dimensions (e.g., thickness) of the electronic package can be reduced, or the supports 530 can be separated from one another. In some examples, a portion of the support frame 544 is removed and the remaining portion can be used as a ground plane or a heatsink as previously described herein and shown in the example of FIG. 3. In examples including a support frame panel 562 and a plurality of dies (e.g., 502A-C), a portion of the support frame panel 562 or the entire support frame panel 562 can be removed before the plurality of electronic packages are separated from one another.

Figure 5F:
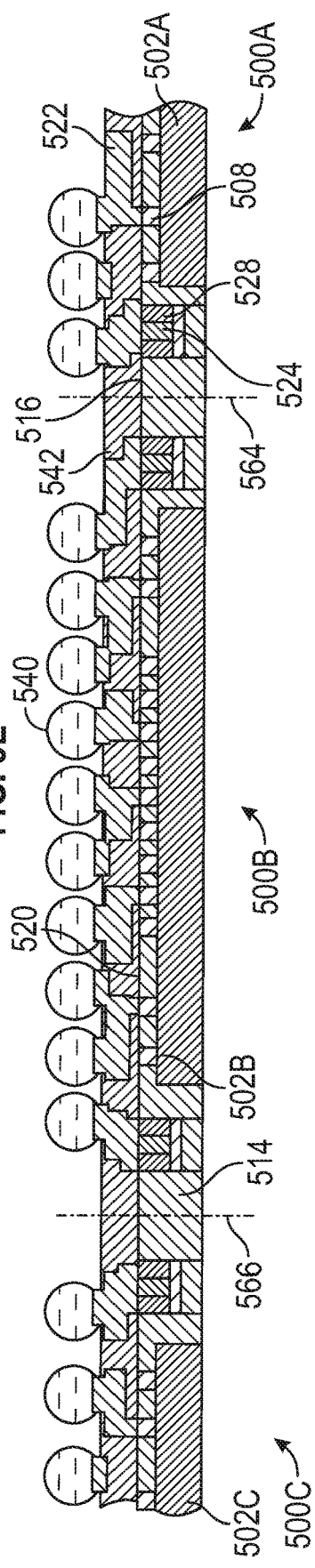

In the Example of FIG. 5F, at least one routing layer 522 can be electrically coupled to the die through at least one respective conductive pillar 508 or electrically coupled to at least one of the passive components 524 through one or more of the leads 528. In an example, the routing layer 522 can be disposed on the first surface 516. In some examples, a dielectric layer 542 can be disposed between the first surface 516 and the routing layer 522. For instance, the routing layer 522 and the dielectric layer 542 can be included in a redistribution layer, substrate, printed circuit board (PCB), bumpless buildup layer (BBUL) flexible circuit, or the like. In some examples, a plurality of solder balls 540 can be electrically coupled to the contacts of the routing layer 522 for electrically coupling the electronic package to the electronic device.

In examples including a support frame panel 562, where a plurality of electronic packages 500A-C are constructed on the carrier 558, the support frame panel 562 and mold 514 can be separated into a plurality of electronic packages 500A-C. In an example, each electronic package can include at least one die (e.g., die 502A, B, or C), at least one support 530, and at least one passive component 524. The electronic packages 500A-C can be separated by cutting the mold 514, and in some examples, the support frame 544, one or more routing layers 522, one or more dielectric layers 542, or a combination thereof. As shown in the example of FIG. 5F, the electronic packages can be separated along the cutting planes 564, 566.

In an example, a protection layer can be disposed along the flat mounting surface 520 (e.g., the first surface 516, distal end 512 of the conductive pillars 508, and leads 528). The protection layer can cover the leads 528 and conductive pillars 508 during the removal of the support frame 544, a portion of the support frame 544, or removal of the carrier 558. Accordingly, the protection layer can shield the leads 528 and conductive pillars 508 from damaged caused by further processing of the electronic package, such as the removal of the carrier 558, support frame 544, or the like. In an example, the protection layer can be removed after the support frame 544, portions of the support frame 544, or carrier 558, or a combination thereof are removed.

In other examples, the carrier 558 can be removed before removal of material from the mold 514 to form the flat mounting surface 520. For instance, the carrier 558 can be removed before formation of the flat mounting surface 520 where the mold 514 can provide sufficient support to the electronic package or where the warpage of the mold 514 does not exceed acceptable tolerances for forming the flat mounting surface 520. In a further example, the carrier 558 can be removed prior to removing at least a portion of the support frame 544.

In examples where a via is located between the passive component 524 and the flat mounting surface 520 (e.g., the first surface 516), an aperture can be formed (e.g., drilled or laser drilled) in the mold 514 prior to the formation of the first surface 520 or removal of material from the conductive pillar 508 and via to form the flat mounting surface 520. For instance, after the mold 514 is applied, an aperture can be drilled in the mold 514. The lead 528 can be located at a first end of the aperture and an opening in the mold can be located at the second end of the aperture. A conductive material can be disposed within the aperture to form a via on the lead 528. Material can be removed from the mold 514, the conductive pillar 508, and the via to form the flat mounting surface 520.

Figure 6:
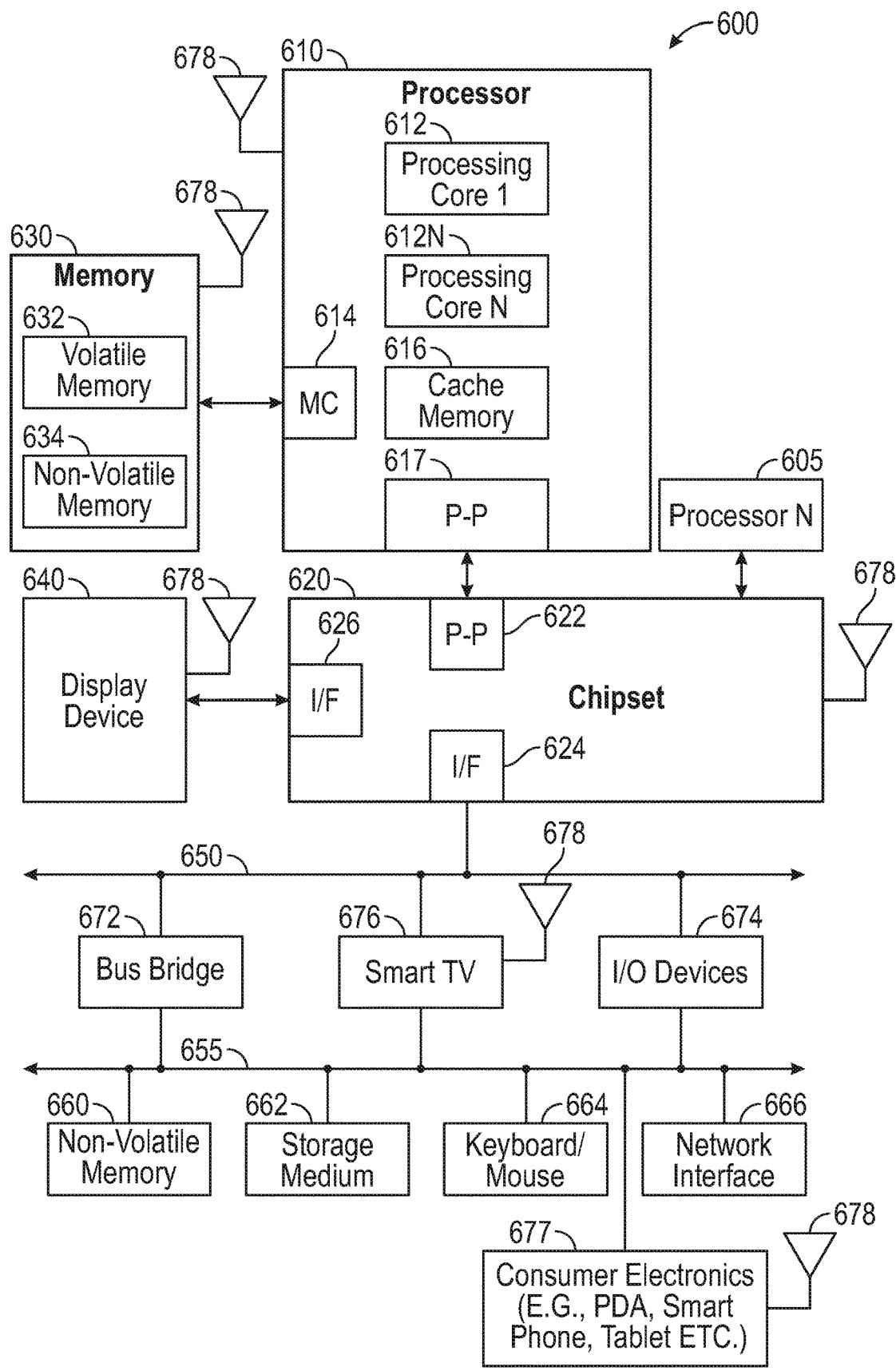
FIG. 6 illustrates a system level diagram in accordance with some embodiments of the invention.

FIG. 6 is a block diagram illustrating an example machine 600 (electronic device) upon which any one or more of the devices (e.g., electronic packages 100, 200, 300, 400, or 500A-C) or techniques discussed herein may perform. In alternative embodiments, the machine 600 may operate as a standalone electronic device or may be connected (e.g., networked) to other machines. The machine 600 may be a personal computer (PC), a tablet PC, a set-top box (STB), a Personal Digital Assistant (PDA), a mobile telephone, a web appliance, a network router, switch or bridge, watch, smartwatch, smart home system, internet-of-things device, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer, or computer system) 600 may include a hardware processor 602 (e.g., a CPU, GPU, a hardware processor core, or any combination thereof), a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, input device 612 and UI navigation device 614 may be a touch screen display. The machine 600 may additionally include a mass storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR)) connection to communicate or control one or more peripheral devices (e.g., a printer, card reader, etc.).

The mass storage device 626 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the mass storage device 616 may constitute machine readable media.

While the machine readable medium 622 is illustrated as a single medium, the term "machine readable medium" may include a single medium or multiple media (e.g., a centralized or distributed database, and/or associated caches and servers) that arranged to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine-readable medium comprises a machine-readable medium with a plurality of particles having resting mass. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received (e.g., transceived) over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 602.11 family of standards known as Wi-Fi IEEE 602.16 family of standards known as WiMAX®), peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

Various Notes & Examples

Each of these non-limiting examples may stand on its own, or may be combined in various permutations or combinations with one or more of the other examples. To better illustrate the method and apparatuses disclosed herein, a non-limiting list of embodiments is provided here:

Example 1 is a face-up fan-out electronic package comprising: a die having a first side and a second side; a plurality of conductive pillars, each conductive pillar including a proximal end communicatively coupled to the first side of the die and a distal end opposite the proximal end; a mold at least partially surrounding the die, the mold including a first surface that is coplanar with the distal end of the conductive pillars and a second surface opposing the first surface; a passive component including a body and a lead, the passive component is located within the mold, and the lead is coplanar with the first surface, wherein the body is located at a distance from the second surface; and a support located between the body and the second surface.

In Example 2, the subject matter of Example 1 optionally includes a routing layer electrically coupled to the distal end of the conductive pillar.

In Example 3, the subject matter of any one or more of Examples 1-2 optionally include wherein the passive component is a first passive component, and the electronic package further comprises a second passive component, the first passive component is located on the support, wherein the support is a first support, and the second passive component located on a second support, the first support including a different height than the second support.

In Example 4, the subject matter of any one or more of Examples 1-3 optionally include an adhesive coupled between the passive component and the support.

In Example 5, the subject matter of any one or more of Examples 1-4 optionally include a support frame, the support frame located along the second surface of the mold and coupled to the support, wherein the support frame holds the support or a plurality of supports in fixed relation with respect to the support frame.

In Example 6, the subject matter of Example 5 optionally includes wherein the support frame is electrically coupled to the die and configured as a ground plane.

In Example 7, the subject matter of any one or more of Examples 5-6 optionally include wherein the support frame is thermally coupled to the second die side and configured as a heat sink.

In Example 8, the subject matter of any one or more of Examples 5-7 optionally include wherein the support frame includes a die holder, the die holder configured to anchor the die with respect to the support.

In Example 9, the subject matter of any one or more of Examples 5-8 optionally include wherein the support frame is exposed through the second surface of the mold.

In Example 10, the subject matter of any one or more of Examples 1-9 optionally include a via located between the lead and the second surface, the via including a first end and a second end, wherein the first end is coplanar with the first surface.

In Example 11, the subject matter of any one or more of Examples 1-10 optionally include the second side of the die is exposed through the second surface of the mold.

In Example 12, the subject matter of any one or more of Examples 1-11 optionally include wherein the support includes a first end and a second end, wherein the second end is exposed through the second surface of the mold.

In Example 13, the subject matter of any one or more of Examples 1-12 optionally include wherein the support is thermally coupled to the second die side and configured as a heat sink.

Example 14 is a method of making a face-up fan-out electronic package having embedded passive components, the method comprising: attaching a support frame to a carrier, wherein the support frame includes at least one support, the support can include a first end and a second end, the second end can be coupled to the support frame and the first end can be located opposite of the second end; attaching a die to the support frame or the carrier, wherein the die includes a first side and a second side, the first side can include a conductive pillar; placing a passive component on the first end of the support, the passive component including a lead; disposing a mold over the die, the passive component, and the conductive pillar, the mold including a first surface opposing a second surface, the second surface located along the second die side; removing material from the mold to expose the conductive pillar and form a flat mounting surface, wherein the conductive pillar is coplanar with the mold; and removing the carrier from the electronic package.

In Example 15, the subject matter of Example 14 optionally includes wherein attaching the support frame includes attaching a support frame panel to the carrier, the support frame panel including a plurality of support frames.

In Example 16, the subject matter of Example 15 optionally includes wherein attaching the die includes attaching a plurality of dies, at least one die is coupled to each respective support frame of the support frame panel.

In Example 17, the subject matter of Example 16 optionally includes separating the support frame panel and mold into a plurality of electronic packages, each electronic package including at least one die, at least one support, and at least one passive component.

In Example 18, the subject matter of any one or more of Examples 14-17 optionally include wherein attaching the die to the carrier includes releasably attaching the die to the carrier.

In Example 19, the subject matter of any one or more of Examples 14-18 optionally include wherein attaching the die to the support frame or the carrier includes locating the die within a die holder of the support frame.

In Example 20, the subject matter of any one or more of Examples 14-19 optionally include removing at least a portion of the support frame from the second surface of the mold.

In Example 21, the subject matter of any one or more of Examples 14-20 optionally include wherein removing material from the mold to expose the conductive pillar and form a flat mounting surface further comprises removing material from the conductive pillar and the lead, wherein the conductive pillar and the lead are coplanar with the mold.

In Example 22, the subject matter of any one or more of Examples 14-21 optionally include a dielectric layer disposed on the first surface of the mold and a routing layer electrically coupled to the conductive pillar or the lead, the routing layer disposed on the dielectric layer.

In Example 23, the subject matter of any one or more of Examples 14-22 optionally include drilling an aperture in the mold, wherein the lead is located at a first end and the aperture has an opening in the mold at a second end; disposing a conductive material within the aperture to form a via on the lead; and wherein removing the material from the mold and conductive pillar includes removing a portion of the via to form the flat mounting surface.

Example 24 is a face-up fan-out electronic package constructed from any one of the method Examples 14-23.

Example 25 is an electronic device including the face-up fan-out electronic package of Example 24.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the frill scope of equivalents to which such claims are entitled.

What is claimed is:

1. A device comprising:
a die having a first side and a second side;
a conductive pillar including a first end communicatively coupled to the first side of the die and a second end opposite the first end;
a mold at least partially surrounding the die, the mold including a first surface that is coplanar with the second end of the conductive pillar and a second surface opposing the first surface and coplanar with the second side of the die;
a passive component including a body and a lead within the mold, the lead and the body coplanar with the first surface; and
a support located between the passive component and the second surface.

2. The electronic package of claim 1, further comprising a routing layer electrically coupled to the second end of the conductive pillar.

3. The electronic package of claim 1, wherein the passive component is a first passive component, and the device further comprises a second passive component, the first passive component is located on the support, wherein the support is a first support, and the second passive component located on a second support, the first support including a different height than the second support.

4. The electronic package of claim 1, further comprising an adhesive coupled between the passive component and the support.

5. The electronic package of claim 1, further comprising a support frame, the support frame located along the second surface of the mold and coupled to the support, wherein the support frame holds the support or a plurality of supports in fixed relation with respect to the support frame.

6. The electronic package of claim 5, wherein the support frame is electrically coupled to the die and configured as a ground plane.

7. The electronic package of claim 5, wherein the support frame is thermally coupled to the second die side and configured as a heat sink.

8. The electronic package of claim 5, wherein the support frame includes a die holder, the die holder configured to anchor the die with respect to the support.

9. The electronic package of claim 5, wherein the support frame is exposed through the second surface of the mold.

10. The electronic package of claim 1, further comprising a via located between the lead and the second surface, the via including a first end and a second end, wherein the first end is coplanar with the first surface.

11. The electronic package of claim 1, the second side of the die is exposed through the second surface of the mold.

12. The electronic package of claim 1, wherein the support includes a first end and a second end, wherein the second end is exposed through the second surface of the mold.

13. A device comprising:
a die having a first side and a second side;
a plurality of conductive pillars, each of the conductive pillars including a first end communicatively coupled to the first side of the die and a second end opposite the first end;
a mold at least partially surrounding the die, the mold including a first surface that is coplanar with the second end of the conductive pillars and a second surface opposing the first surface and coplanar with the second side of the die;
a passive component including a body and a lead within the mold, the lead coplanar with the first surface; and
a support located between the passive component and the second surface.

14. The electronic package of claim 13, further comprising a routing layer electrically coupled to the second end of the conductive pillars.

15. The electronic package of claim 13, wherein the passive component is a first passive component, and the device further comprises a second passive component, the first passive component is located on the support, wherein the support is a first support, and the second passive component located on a second support, the first support including a different height than the second support.

16. The electronic package of claim 13, further comprising an adhesive coupled between the passive component and the support.

17. The electronic package of claim 13, further comprising a support frame, the support frame located along the second surface of the mold and coupled to the support, wherein the support frame holds the support or a plurality of supports in fixed relation with respect to the support frame.

18. The electronic package of claim 17, wherein the support frame is electrically coupled to the die and configured as a ground plane.

19. The electronic package of claim 17, wherein the support frame is thermally coupled to the second die side and configured as a heat sink.

20. The electronic package of claim 17, wherein the support frame includes a die holder, the die holder configured to anchor the die with respect to the support.

* * * * *